(12) United States Patent
Chan et al.

(10) Patent No.: US 7,081,413 B2
(45) Date of Patent: Jul. 25, 2006

(54) METHOD AND STRUCTURE FOR ULTRA NARROW GATE

(75) Inventors: Bor-Wen Chan, Hsin-Chu (TW); Baw-Ching Perng, Hsin-Chu (TW); Ying-Tsung Chen, Chiayi (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 217 days.

(21) Appl. No.: 10/763,688

(22) Filed: Jan. 23, 2004

(65) Prior Publication Data

US 2005/0164503 A1 Jul. 28, 2005

(51) Int. Cl.
*H01L 21/461* (2006.01)
*H01L 21/302* (2006.01)

(52) U.S. Cl. ............... 438/706; 438/713; 438/714; 438/717; 438/719

(58) Field of Classification Search ............... None
See application file for complete search history.

(56) References Cited

U.S. PATENT DOCUMENTS

| 6,110,837 | A | 8/2000 | Linliu et al. |
| 6,150,263 | A | 11/2000 | Lin et al. |
| 6,630,381 | B1 * | 10/2003 | Hazani ............... 438/260 |
| 6,794,230 | B1 * | 9/2004 | Huang et al. ............... 438/154 |
| 6,878,646 | B1 * | 4/2005 | Tsai et al. ............... 438/75 |
| 2004/0018741 | A1 * | 1/2004 | Deshmukh et al. ............... 438/710 |
| 2004/0057264 | A1 * | 3/2004 | Houdt et al. ............... 365/45 |
| 2005/0087809 | A1 * | 4/2005 | Dokumaci et al. ............... 257/365 |

* cited by examiner

*Primary Examiner*—Duy-Vu N. Deo
(74) *Attorney, Agent, or Firm*—Duane Morris LLP

(57) ABSTRACT

A method for forming an ultra narrow semiconductive gate structure utilizes a tapered hardmask covered by an oxide liner. The tapered hardmask is formed over the semiconductive gate material by tapered etching. After the tapered hardmask structure is formed over the semiconductive material, an oxide layer is formed over the tapered hardmask. A sequence of highly selective etch operations are carried out to etch uncovered portions of the semiconductive gate material while the portions of the gate material covered by the tapered hardmask and oxide film remain unetched to form ultra narrow gate structures.

16 Claims, 5 Drawing Sheets

US 7,081,413 B2

METHOD AND STRUCTURE FOR ULTRA NARROW GATE

FIELD OF THE INVENTION

The present invention relates, most generally, to semiconductor devices and methods for forming the same. More particularly, the present invention relates to ultra narrow transistor gate structures.

BACKGROUND

In today's rapidly developing semiconductor manufacturing industry, there is a constant drive to increase levels of integration and reduce chip size by reducing device feature sizes. Because of other advances in semiconductor device processing capabilities, it would be desirable and advantageous to produce increasingly miniaturized physical structures such as transistor gates and the like, that have dimensions such as gate lengths, on the order of 10 nanometers.

Existing limitations in presently available photolithography processes make it difficult to produce the ultra narrow device features needed to keep up with other advancing aspects of semiconductor manufacturing technology. Some previous attempts at reducing device feature sizes include photoresist trimming and hardmask trimming. Photoresist trimming is difficult to do because of the photoresist thicknesses required for sub-193 nm or sub-157 nm photoresist. Hardmask trimming typically results in rough edges and uncertain critical dimensions of the device structure being produced.

It would therefore be desirable to produce semiconductor device features such as transistor gates, that have dimensions on the order of 10 nanometers.

SUMMARY OF THE INVENTION

To achieve these and other objects, and in view of its purposes, the present invention addresses the shortcomings of conventional technology and provides a method and structure for forming ultra narrow gate structures.

In one exemplary embodiment, the present invention provides a method for forming a semiconductor device. The method includes providing a structure of a semiconductive material with a hardmask thereover. The hardmask includes at least one tapered portion, each tapered portion having a corresponding portion of a further film disposed thereover. The method further provides for etching an uncovered portion of the hardmask to expose an exposed portion of the semiconductive gate material while maintaining the tapered portion(s) and each of the corresponding portions of the further film, substantially intact. The method further provides for etching the exposed portion of the semiconductive material while maintaining the tapered portion(s) and each of the corresponding portions of the further film, essentially intact.

In another exemplary embodiment, the present invention provides a method for forming a semiconductor device by providing a layer of hardmask material over a semiconductor substrate, forming a photoresist pattern over the layer of hardmask material and etching to produce a discrete portion of the hardmask material having at least one tapered portion with a taper angle within the range of 45° to 85° with respect to the semiconductor substrate surface. A photoresist strip process is then carried out. An oxide layer is formed over the discrete portion of hardmask. The method further provides for removing portions of the oxide layer and planarizing to produce the discrete portion having tapered portions covered by the oxide layer as well a substantially planar uncovered portion.

In yet another exemplary embodiment, the present invention provides a semiconductor device comprising a semiconductive material formed over a substrate, having a width no greater than 10 nm and a top surface substantially parallel to the substrate. A hardmask is formed on the top surface and has an angled upper surface with an oxide film formed thereover, the angled upper surface and the top surface forming an angle ranging from 45° to 85°.

In yet another exemplary embodiment, the present invention provides a semiconductor device comprising a discrete semiconductive material structure formed over a substrate surface and having a top surface substantially parallel to the substrate surface. The structure includes at least one masked portion having a hardmask formed on the top surface, the hardmask having an angled upper surface. An oxide film is formed over the angled upper surface. The angled upper surface and the top surface of the discrete semiconductor material structure form an angle which may range from 45° to 85°.

BRIEF DESCRIPTION OF THE DRAWINGS

The present invention is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawings. Included are the following figures.

DETAILED DESCRIPTION

Figure 1:
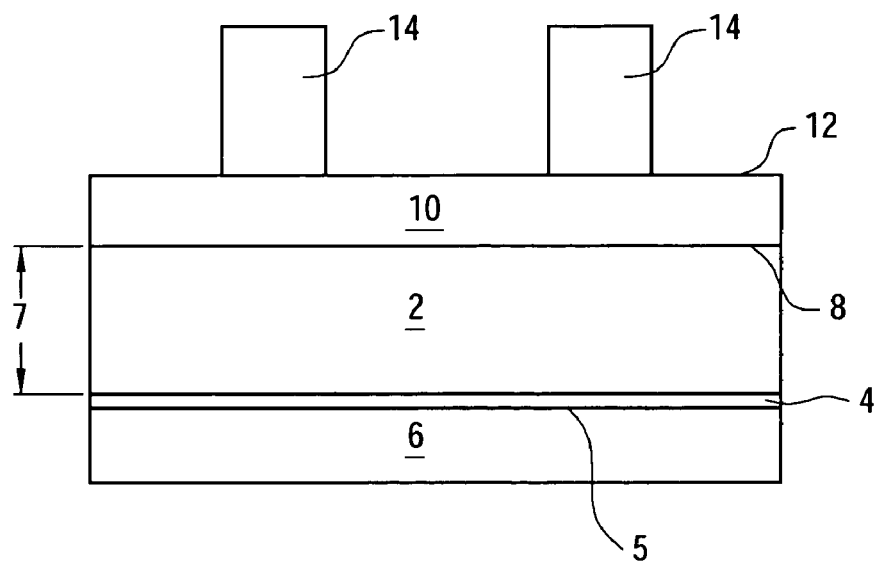
FIGS. 1–10 are cross-sectional views that, together, illustrate an exemplary process sequence used to form ultra narrow gate structures according to the present invention.

FIG. 1 is a cross-sectional view showing semiconductive film 2 formed over film 4 which is formed, in turn, over substrate 6. Substrate 6 includes substrate surface 5 and may represent a semiconductor substrate or wafer, or it may represent any of various films or other structures formed over a raw semiconductor substrate or wafer. Film 4 may be an etch stop film or any of various films used in the manufacture of semiconductor devices. In one exemplary embodiment, film 4 may be a gate dielectric. Semicondutive film 2 is a film commonly used as a gate electrode in semiconductor devices. Semiconductive film 2 may be doped or undoped polycrystalline silicon (i.e., polysilicon), for example. Semiconductive film 2 includes thickness 7 and top surface 8 which is substantially parallel to substrate surface 5. Thickness 7 may lie within the range of 300 to 2000 angstroms in various exemplary embodiments, but other thicknesses may be used in other exemplary embodiments. Hardmask 10 is a film formed over top surface 8 of semiconductive film 2 and may be formed of SiON, SiN or various other suitable hardmask materials. Patterned photoresist layer 14 is formed over surface 12 of hardmask 10. Various photoresist materials and suitable methods for patterning the photoresist, may be used.

A suitable etching process is then used to sequentially etch portions of hardmask 10 and semiconductive film 2 using patterned photoresist layer 14 as a mask. Etchant gas species such as $CF_4$, $CHF_3$, $CH_2F_2$, $CH_3F$, $C_5F_8$, CO, Ar, and $O_2$ may be used in various combinations to etch hardmask 10. It can be seen that etched hardmask 10 includes discrete portions 18 that each include a tapered shape including tapered surfaces 20. The taper may include a taper angle 19 that may range from 5° to 45° in various exemplary embodiments. As such, tapered surfaces 20 form angles that may range from 45° to 85° with respect to substrate surface 5 and top surface 8. The tapered shape is produced by the etch process and taper angle 19 can be controlled by the etch chemistry and other parameters. For example, polymers such as $CH_2F_2$, $CH_3F$, and CO may be used to increase taper angle 19. Using hardmask 10 as a mask, various suitable and conventional etching processes may be used to etch semiconductive material 2 and to form the structures of semiconductive material 2 having substantially vertical sidewalls.

After etch, semiconductive material 2 is a discrete structure that includes width 16 which may range from 50–500 nanometers in one exemplary embodiment, but other widths may be used in other exemplary embodiments. The structure shown in FIG. 2 is shown after at least one conventional photoresist strip process has been used to remove any residual photoresist from over the top of tapered hardmask 10.

Figure 2:
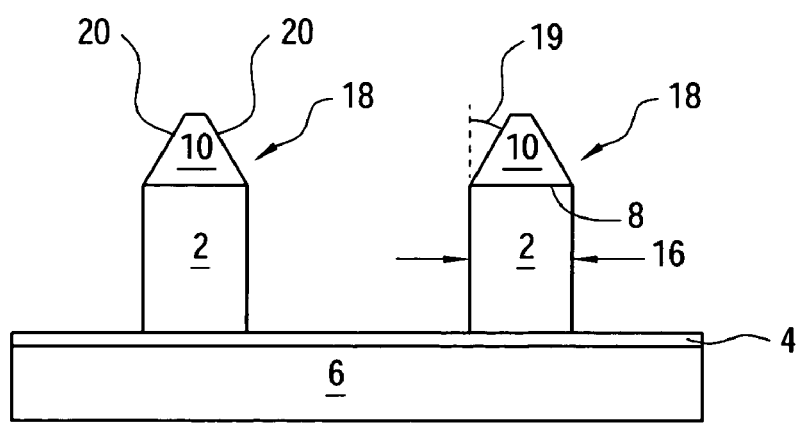
Figure 3:
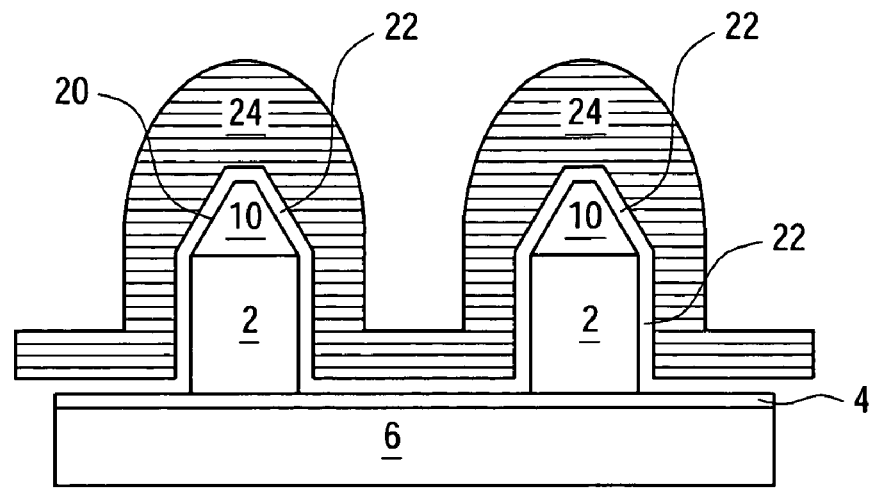
Figure 4:
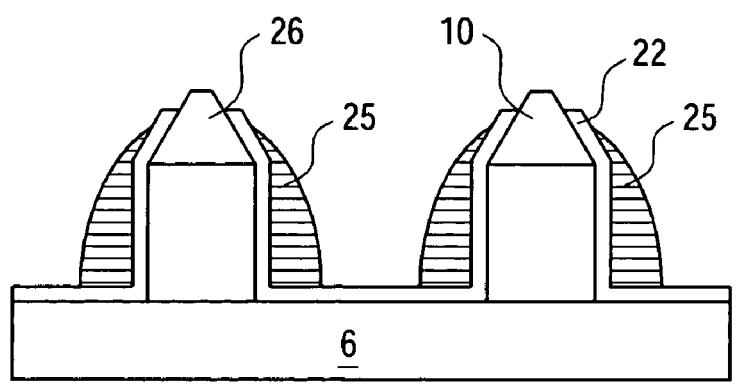

FIG. 3 shows the structure in FIG. 2 after lining oxide 22 and spacer dielectric 24 have been formed using conventional processes. Lining oxide 22 is formed on tapered surfaces 20 of hardmask 10 and is a deposited film in an exemplary embodiment. Conventional CVD (chemical vapor deposition) methods may be used. FIG. 4 shows the structure of FIG. 3 after a spacer etch has been carried out to remove significant portions of spacer dielectric 24 and form spacers 25. During the spacer etch process, exposed portions 26 of hardmask 10, are created when portions of spacer dielectric 24 and lining oxide 22 are removed.

Figure 5:
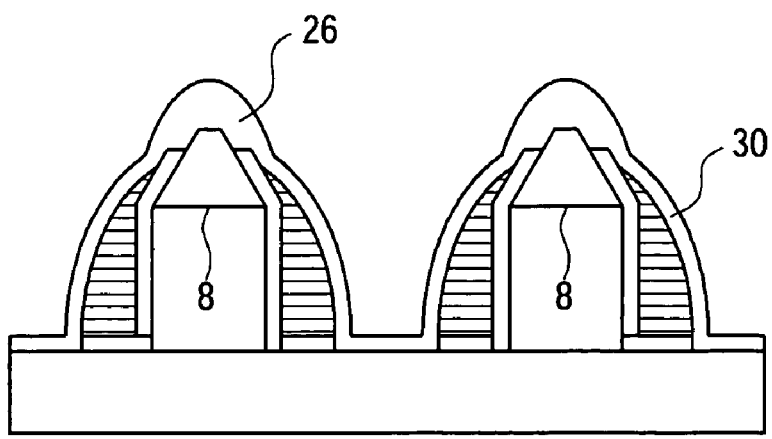

FIG. 5 shows the structure of FIG. 4 after etch stop layer 30 has been formed. Etch stop layer 30 may be SiN, SiON, or various other suitable etch stop layers commonly used in the semiconductor manufacturing industry.

Figure 6:
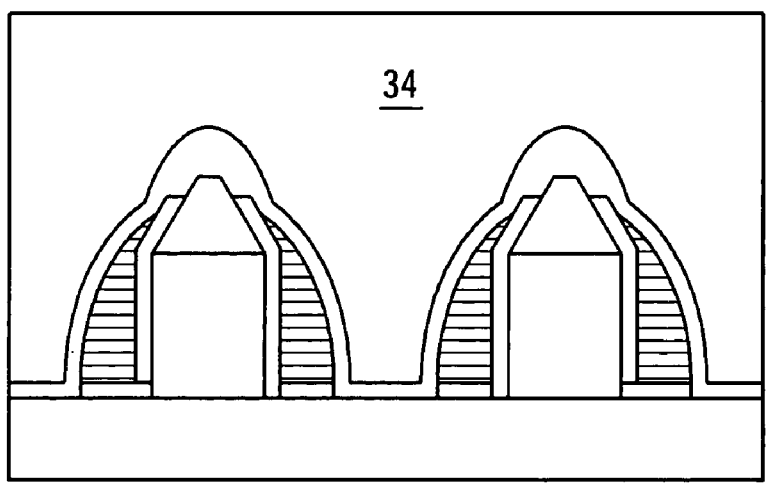

FIG. 6 shows the structure of FIG. 5 after ILD (interlevel dielectric) 34 has been formed. ILD 34 may be a doped or undoped oxide or any of various other interlevel dielectrics suitably used in the semiconductor manufacturing industry. The structure shown in FIG. 6 is then polished/planarized to produce the structure shown in FIG. 7. Chemical mechanical polishing (CMP) may be used to planarize the structure. The planarized structure (FIG. 7) includes planarized surface 38. The planarizing process planarizes uncovered portions 40 of hardmask 10. Each hardmask 10 portion now includes uncovered portion 40 and a duality of tapered portions 44 each having tapered surface 20 covered with lining oxide 22. The CMP planarizing process may be chosen so that the maximum thickness 42 of hardmask 10 is at least 200 angstroms, but other maximum thicknesses 42 may be used. Lining oxide 22 masks tapered portions 44 of hardmask 10 which, in turn, mask associated subjacent portions of semiconductive film 2 during the etching operations to produce the ultra narrow gate structures of the present invention.

Figure 7:
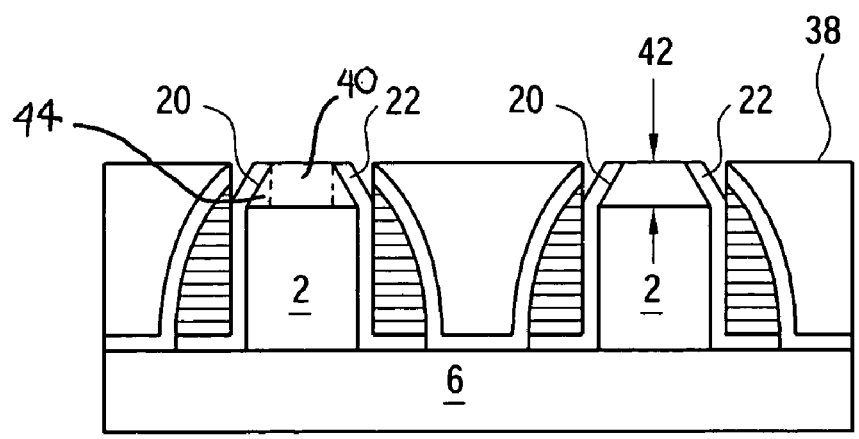
Figure 8:
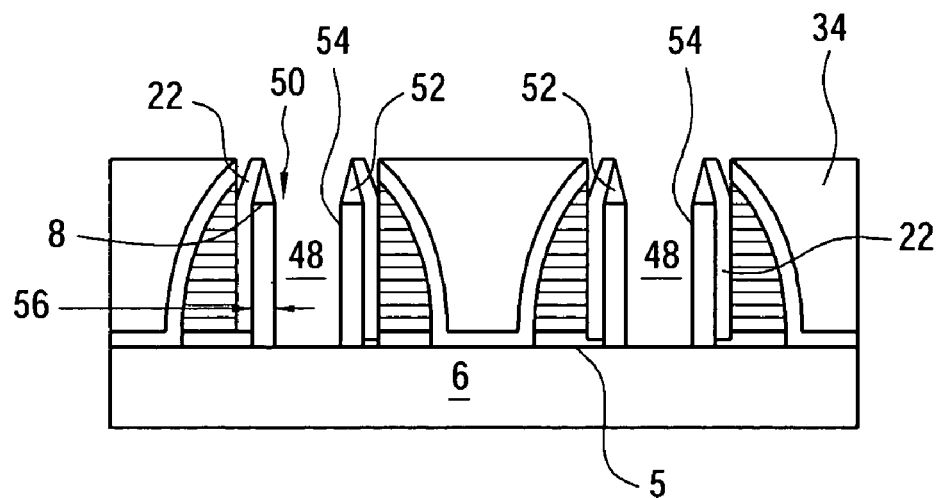

FIG. 8 shows the structure in FIG. 7 after a sequence of etching operations have been carried out to produce the ultra narrow gate structures. First, uncovered portion 40 of hardmask 10 is etched to expose the subjacent portion of semiconductive film 2. An etching process with a high [hardmask material:lining oxide] etch selectivity is used so that uncovered portion 40 of hardmask 10 is removed to expose the subjacent portion of semiconductive film 2 while lining oxide 22 and therefore tapered portions 44 of hardmask 10 remain substantially intact. In an exemplary embodiment, a [hardmask material:lining oxide] etch selectivity ranging from 5:1 to 10:1 may be used. An exemplary etch process may include a pressure of 4 to 100 mTorr, a top power of 50 to 1000 W, a bias power of 10 to 200 W and an etch chemistry of $CH_2F_2$ at 10–100 sccm, $CH_3F$ at 10–100 sccm and $O_2$ at 1–50 sccm. Oth etch processes with other etch chemistries may be used in other exemplary embodiments.

After this etching operation, a further etching operation is used to remove the exposed, subjacent portion of semiconductive film 2 to form openings 48 and gate structures 50. The etch process used to etch semiconductive film 2 includes a high [semiconductive film:lining oxide] etch selectivity and a high [semiconductive film:hardmask material] etch selectivity so that tapered portions 44 and lining oxide 22 remain essentially intact during the etch operation used to etch semiconductive film 2. In an exemplary embodiment, a [semiconductive film:lining oxide] etch selectivity ranging from 50:1 to 100:1 may be used and a [semiconductive film:hardmask material] etch selectivity ranging from 50:1 to 100:1 may be used. In an exemplary embodiment, the etch process may include the following conditions—pressure 4–100 mTorr; top power 50–1000 W; bias power 10–200 W; and an etch chemistry of $Cl_2$ at 10–100 sccm, HBr at 10–100 sccm, $HeO_2$ or $O_2$ at 1–50 sccm. This etch process is exemplary only and other etch processes may be used in other exemplary embodiments. FIG. 8 shows gate structures 50 which include semiconductive gates 54 formed of semiconductive material 2 disposed over substrate 6 and including top surfaces 8. In an exemplary embodiment, semiconductive gates 54 may include width 56 being no greater than 10 nm, but other widths may be produced in other exemplary embodiments. Hardmask members 52 are formed on top surfaces 8 and include tapered surfaces 20. Each tapered surface 20 may form an angle ranging from 45° to 85° with respect to substrate surface 5 and top surface 8 in an exemplary embodiment, but other angles may be produced in other exemplary embodiments. Tapered surfaces 20 are covered by lining oxide 22.

Figure 9:
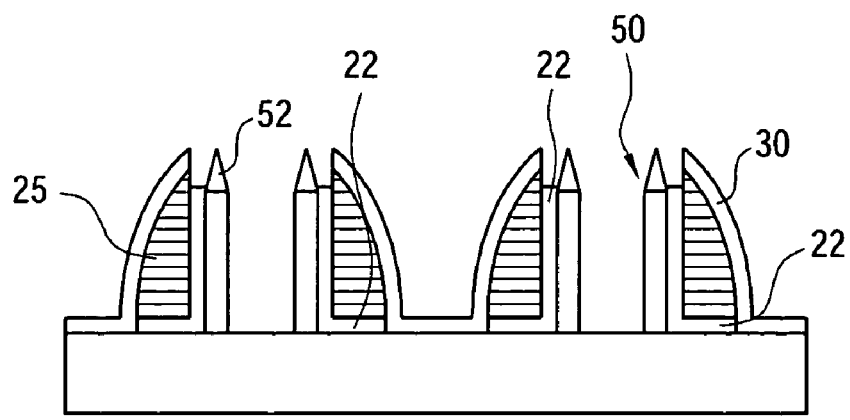

Subsequent conventional stripping operations may be used to selectively remove ILD 34 to produce the structure shown in FIG. 9. Various wet etching procedures such as HF etching may be used.

Figure 10:
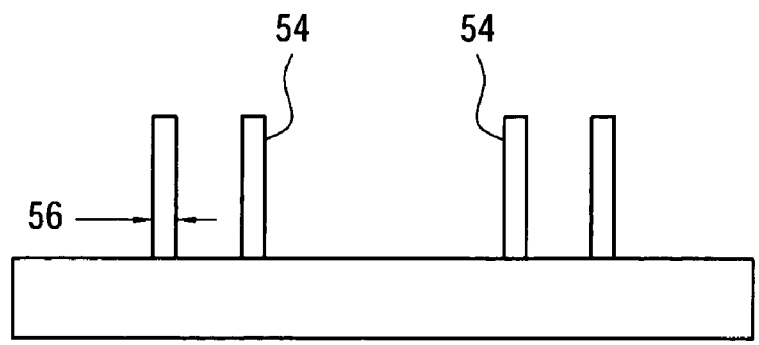

A further stripping operation such as hot $H_3PO_4$ etching may be used to selectively strip etch stop layer 30 and to remove spacers 25, hardmask members 52 and any remaining lining oxide 22, to produce the structure shown in FIG. 10. FIG. 10 shows a plurality of semiconductive gates 54 formed from semiconductive film 2 and having widths 56. Width 56 may be under 10 nanometers in an advantageous embodiment, but other gate widths 56 may be used in various exemplary embodiments.

The ultra narrow gates of the present invention find various application in semiconductor devices and are particularly suited to be used as transistor gates for advanced semiconductor devices. In particular, the ultra narrow gates of the present invention are well suited for the tight geometrical requirements of SRAM (static random access memory) cells.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. For example, the structures produced by the present invention may be used as transistor gates and other device structures in various technologies. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
   providing a structure of a semiconductive material with a hardmask thereover, said hardmask having at least one tapered portion with a corresponding portion of a further film disposed thereover;
   etching an uncovered portion of said hardmask to expose an exposed portion of said semiconductive material while maintaining said at least one tapered portion and each said corresponding portion substantially intact; and
   etching said exposed portion of said semiconductive material while maintaining said at least one tapered portion and each said corresponding portion substantially intact.

2. The method as in claim 1, wherein said providing comprises providing said hardmask with an originally tapered upper surface covered by said further film, and removing a first portion of said originally tapered upper surface and a first portion of said further film to produce said hardmask having said at least one tapered portion with a corresponding portion of said further film disposed thereover, and said uncovered portion.

3. The method as in claim 2, wherein said removing comprises chemical mechanical polishing.

4. The method as in claim 2, wherein said further film comprises an oxide liner and said removing includes forming a spacer oxide material over said further film and etching portions of said spacer oxide material and said first portion of said further film.

5. The method as in claim 4, wherein said removing further includes, after said etching said portions of spacer oxide material and said first portion, forming an etch stop layer thereover and an interlevel dielectric over said etch stop layer, then planarizing such that said uncovered portion of said hardmask is planarized.

6. The method as in claim 1, wherein said further film comprises an oxide film.

7. The method as in claim 6, wherein said etching an uncovered portion of said hardmask includes a hardmask:further film etch selectivity ranging from 5:1 to 10:1.

8. The method as in claim 1, wherein said semiconductive material comprises polycrystalline silicon.

9. The method as in claim 1, wherein, after said etching said exposed portion of said semiconductive material, removing said at least one tapered portion with a corresponding portion of a further film disposed thereover, thereby producing at least one corresponding gate structure of said semiconductive material.

10. The method as in claim 9, wherein each of said at least one corresponding gate structure includes a width of about 10 nanometers.

11. The method as in claim 1, wherein said structure of a semiconductive material includes a width within the range of 50 to 500 nanometers.

12. The method as in claim 1, wherein said etching said subjacent portion of said semiconductive material includes a semiconductive material:hardmask etch selectivity ranging from 50:1 to 100:1.

13. The method as in claim 1, wherein said hardmask is formed of SiN or SiON.

14. The method as claim 1, wherein said providing includes providing a layer of material of said hardmask over a semiconductor substrate surface and etching to produce said hardmask having at least one tapered portion, each tapered portion having a taper angle within the range of 45° to 85° with respect to said semiconductor substrate surface.

15. A method for forming a semiconductor device comprising:
   providing a layer of hardmask material over a semiconductor substrate;
   forming a photoresist pattern over said layer of hardmask material;
   etching to produce a discrete portion of said hardmask material, said discrete portion having at least one tapered section with a taper angle within the range of 45° to 85° with respect to a surface of said semiconductor substrate;
   carrying out a photoresist strip process;
   forming an oxide layer over said discrete portion;
   removing portions of said oxide layer and planarizing to produce said discrete portion having a substantially planar uncovered portion and each tapered section having a corresponding portion of said oxide layer thereover.

16. The method as in claim 15, in which said etching includes at least one etchant species chosen from the group consisting of $CF_4$, $CHF_3$, $CH_2F_2$, $CH_3F$, $C_5F_8$, CO, Ar, and $O_2$.

* * * * *